(12) United States Patent
Hong et al.

(10) Patent No.: US 12,027,194 B2
(45) Date of Patent: *Jul. 2, 2024

(54) SEMICONDUCTOR MEMORY DEVICE AND MEMORY SYSTEM HAVING THE SAME

(71) Applicant: SAMSUNG ELECTRONICS CO., LTD., Suwon-si (KR)

(72) Inventors: Seungki Hong, Incheon (KR); Geuntae Park, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/093,473

(22) Filed: Jan. 5, 2023

(65) Prior Publication Data

US 2023/0143397 A1 May 11, 2023

Related U.S. Application Data

(63) Continuation of application No. 17/354,364, filed on Jun. 22, 2021, now Pat. No. 11,568,914.

(30) Foreign Application Priority Data

Dec. 23, 2020 (KR) .................. 10-2020-0181949

(51) Int. Cl.
*G11C 7/00* (2006.01)
*G11C 11/406* (2006.01)
(Continued)

(52) U.S. Cl.
CPC .. *G11C 11/40615* (2013.01); *G11C 11/40603* (2013.01); *G11C 11/40622* (2013.01);
(Continued)

(58) Field of Classification Search
CPC ........ G11C 11/40615; G11C 11/40603; G11C 11/40622; G11C 11/4085; G11C 11/4091; G11C 11/4094
(Continued)

(56) References Cited

U.S. PATENT DOCUMENTS 9,653,139 B1   5/2017  Park
9,892,779 B2   2/2018  Kang et al.
(Continued)

*Primary Examiner* — Viet Q Nguyen
(74) *Attorney, Agent, or Firm* — Sughrue Mion, PLLC

(57) ABSTRACT

A semiconductor memory device and a memory system are provided. The semiconductor memory device includes a memory cell array, a normal refresh row address generator, a hammer refresh row address generator, a refresh selection signal generator, and a selector. The normal and hammer refresh row address generators generates a normal refresh row address and a hammer refresh row address, respectively, in response to a refresh counting control signal. The refresh selection signal generator sequentially generates normal and hammer refresh selection signals in response to the refresh counting control signal. The selector selects the normal refresh row address or the hammer refresh row address in response to the normal and hammer refresh selection signals. A normal refresh operation and a hammer refresh operation are sequentially performed on a memory cell array block among plural memory cell array blocks in response to the refresh row address.

16 Claims, 6 Drawing Sheets

(51) Int. Cl.
*G11C 11/408* (2006.01)
*G11C 11/4091* (2006.01)
*G11C 11/4094* (2006.01)

(52) U.S. Cl.
CPC ...... *G11C 11/4085* (2013.01); *G11C 11/4091* (2013.01); *G11C 11/4094* (2013.01)

(58) Field of Classification Search
USPC .......................................................... 365/222
See application file for complete search history.

(56) References Cited

U.S. PATENT DOCUMENTS

| | | |
|---|---|---|
| 10,032,501 B2 | 7/2018 | Ito et al. |
| 10,192,608 B2 | 1/2019 | Morgan |
| 10,424,362 B2 | 9/2019 | Nakaoka |
| 10,580,475 B2 | 3/2020 | Morohashi et al. |
| 10,607,683 B2 * | 3/2020 | Shin .................. G11C 11/40618 |
| 10,755,763 B2 | 8/2020 | Morgan |
| 10,950,289 B2 | 3/2021 | Ito et al. |
| 11,011,219 B2 * | 5/2021 | Yen .................... G11C 11/4087 |
| 11,043,254 B2 | 6/2021 | Enomoto et al. |
| 11,356,081 B2 | 6/2022 | Noguchi |
| 11,508,429 B2 * | 11/2022 | Choi ................. G11C 11/40615 |
| 11,568,914 B2 * | 1/2023 | Hong ................ G11C 11/40618 |
| 2019/0221251 A1 | 7/2019 | Nakaoka |
| 2019/0333573 A1 | 10/2019 | Shin et al. |
| 2022/0270662 A1 * | 8/2022 | Kang ................... G06F 3/0673 |

\* cited by examiner

SEMICONDUCTOR MEMORY DEVICE AND MEMORY SYSTEM HAVING THE SAME

CROSS-REFERENCE TO THE RELATED APPLICATION

This application is a continuation application of U.S. application Ser. No. 17/354,364, filed on Jun. 22, 2021, which is based on and claims priority from Korean Patent Application No. 10-2020-0181949, filed on Dec. 23, 2020, in the Korean Intellectual Property Office, the disclosure of which is herein incorporated by reference in its entirety.

BACKGROUND

1. Field

Devices and systems consistent with the present disclosure relate to a semiconductor memory device and a memory system having the same.

2. Description of the Related Art

A dynamic random access memory (DRAM) may include a plurality of dynamic memory cells configured to store data, and each cell may include one transistor and one capacitor. The DRAM may perform a normal refresh operation on the plurality of dynamic memory cells every a refresh period to maintain data stored in the plurality of dynamic memory cells even when power is supplied. Further, the DRAM may additionally perform a hammer refresh operation on dynamic memory cells adjacent to dynamic memory cells which are frequently accessed since data stored in the dynamic memory cells adjacent to the dynamic memory cells which are frequently accessed is lost faster than data stored in dynamic memory cells adjacent to dynamic memory cells which are normally accessed.

SUMMARY

It is an aspect to provide a semiconductor memory device capable of efficiently performing a normal refresh operation and a hammer refresh operation, and a memory system having the same.

According to an aspect of one or more embodiments, there is provided a semiconductor memory device comprising a memory cell array comprising a plurality of memory cell array blocks; a normal refresh row address generator configured to generate a refresh counting control signal in response to a refresh command, and generate a normal refresh row address in response to the refresh counting control signal; a hammer refresh row address generator configured to generate a hammer refresh row address in response to the refresh counting control signal; a refresh selection signal generator configured to sequentially generate a normal refresh selection signal and a hammer refresh selection signal in response to the refresh counting control signal; and a selector configured to select the normal refresh row address as a refresh row address in response to the normal refresh selection signal, and select the hammer refresh row address as the refresh row address in response to the hammer refresh selection signal, wherein a normal refresh operation and a hammer refresh operation are sequentially performed on at least one memory cell array block among the plurality of memory cell array blocks in response to the refresh row address.

According to another aspect of one or more embodiments, there is provided a semiconductor memory device comprising a memory cell array comprising a plurality of memory cell array blocks, each comprising a plurality of dynamic memory cells connected between a plurality of word lines and a plurality of bit lines, and in which a plurality of main word lines are arranged, and a plurality of sense amplification blocks arranged between the plurality of memory cell array blocks and in which a plurality of word line selection signal lines are arranged; a command and address generator configured to receive a command and address which is externally applied, and decode the command and address to generate a row address with an active command, generate a column address with a read command or a write command, and generate a refresh command; a normal refresh row address generator configured to generate a refresh counting control signal in response to the refresh command, and generate a normal refresh row address in response to the refresh counting control signal; a hammer refresh row address detector and generator configured to receive the row address in response to the active command, detect a hammer row address, and generate the hammer row address as a hammer refresh row address in response to the refresh counting control signal; a refresh selection signal generator configured to sequentially generate a normal refresh selection signal and a hammer refresh selection signal in response to the refresh counting control signal; a selector configured to select the normal refresh row address as a refresh row address in response to the normal refresh selection signal, and select the hammer refresh row address as the refresh row address in response to the hammer refresh selection signal; and a row decoder configured to decode the refresh row address to activate one among a plurality of main word line selection signals and one among the plurality of word line selection signals of at least one memory cell array block among the plurality of memory cell array blocks.

According to yet another aspect of one or more embodiments, there is provided a memory system comprising a controller comprising a processor configured to execute a program to generate an internal command, an internal address, and internal data, a command and address generator configured to receive the internal address to generate a command and address, and a data input and output circuit configured to receive the internal data to generate data or receive the data to generate the internal data; and a semiconductor memory device configured to receive the command and address to input or output the data. The semiconductor memory device comprises a memory cell array comprising a plurality of memory cell array blocks; a normal refresh row address generator configured to generate a refresh counting control signal in response to a refresh command, and generate a normal refresh row address in response to the refresh counting control signal; a hammer refresh row address generator configured to generate a hammer row address as a hammer refresh row address in response to the refresh counting control signal; a refresh selection signal generator configured to sequentially generate a normal refresh selection signal and a hammer refresh selection signal in response to the refresh counting control signal; and a selector configured to select the normal refresh row address as a refresh row address in response to the normal refresh selection signal, and select the hammer refresh row address as the refresh row address in response to the hammer refresh selection signal. A normal refresh operation and a hammer refresh operation are sequentially performed on at least one memory cell array block among the plurality of memory cell array blocks in response to the refresh row address.

DETAILED DESCRIPTION

Hereinafter, a semiconductor memory device and a memory system having the same according to various exemplary embodiments will be described more fully hereinafter with reference to the accompanying drawings.

Figure 1:
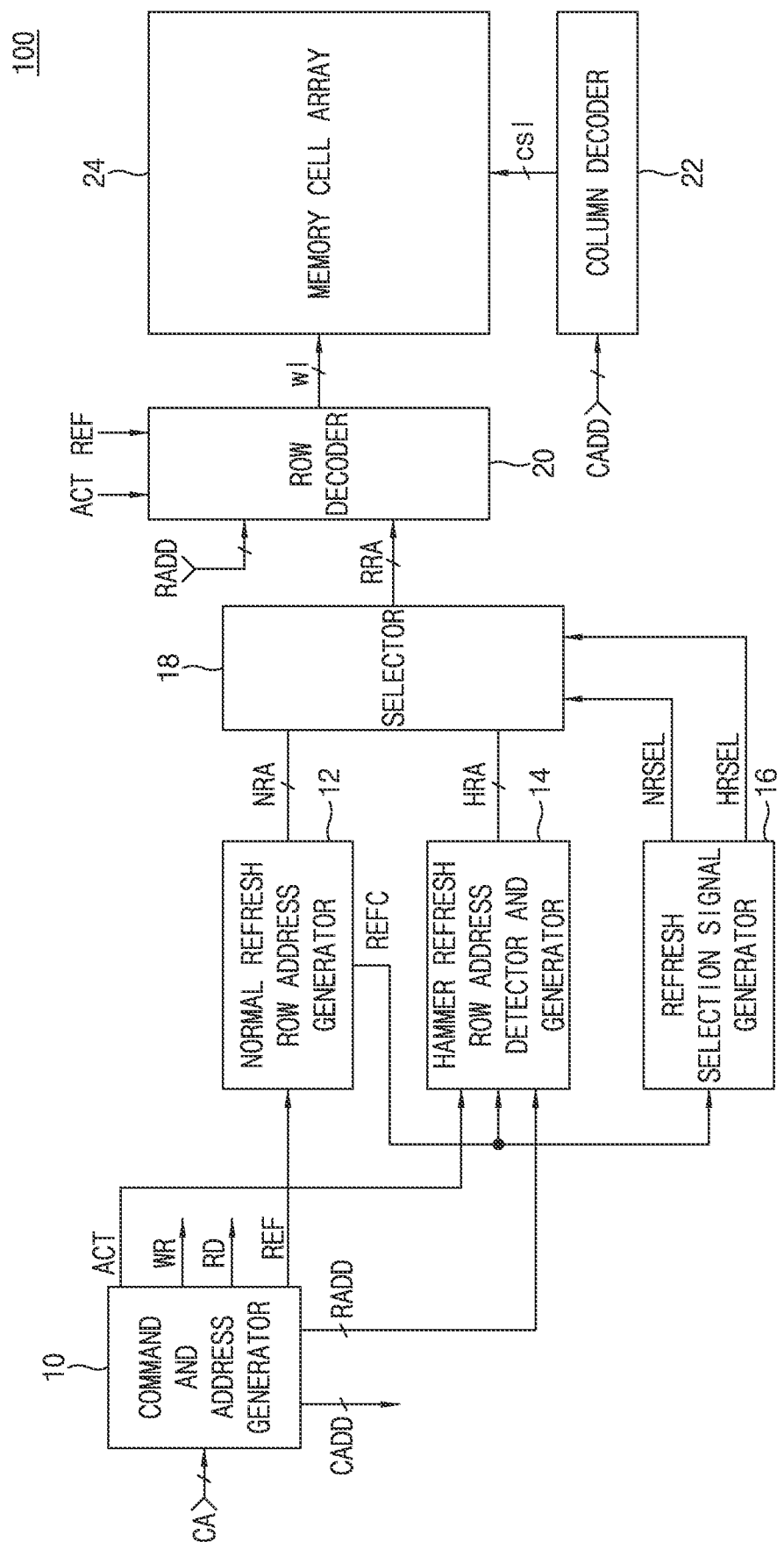
FIG. 1 is a block diagram showing a configuration of a semiconductor memory device according to an exemplary embodiment.

FIG. 1 is a block diagram showing a configuration of a semiconductor memory device according to an exemplary embodiment. A semiconductor memory device 100 may include a command and address generator 10, a normal refresh row address generator 12, a hammer refresh row address detector and generator 14, a refresh selection signal generator 16, a selector 18, a row decoder 20, a column decoder 22, and a memory cell array 24.

A function of each of the blocks shown in FIG. 1 will be described below.

The command and address generator 10 may decode a command included in the command and address CA to generate an active command ACT, a read command RD, a write command WR, and a refresh command REF, and receive an address included in the command and address CA to generate a row address RADD and a column address CADD. The row address RADD may be applied with the active command ACT, and the column address CADD may be applied with the read command RD or the write command WR. The refresh command REF may be an auto refresh command or a self refresh command. When the refresh command REF is the auto refresh command, the refresh command REF may be applied from an external controller (not shown), and when the refresh command REF is the self refresh command, the refresh command REF may be internally generated.

The normal refresh row address generator 12 may receive the refresh command REF, generate a refresh counting control signal REFC in response to the refresh command REF, and perform a counting operation in response to the refresh counting control signal REFC to generate a normal refresh row address NRA.

The hammer refresh row address detector and generator 14 may receive the row address RADD in response to the active command ACT to detect a hammer aggressive row address, store a hammer victim row address adjacent to the hammer aggressive row address as a hammer row address, and generate the hammer row address as a hammer refresh row address HRA in response to the refresh counting control signal REFC. As one example, when an identical row address RADD is received a threshold number of times or more in response to the active command ACT, the hammer refresh row address detector and generator 14 may detect the identical row address RADD as the hammer aggressive row address. The threshold may be preset or may be set during operation. As another example, the hammer refresh row address detector and generator 14 may randomly detect the row address RADD received in response to the active command ACT to generate the detected row address RADD as the hammer aggressive row address. The hammer refresh row address detector and generator 14 may detect the hammer refresh row address in various manners.

The refresh selection signal generator 16 may sequentially generate a normal refresh selection signal NRSEL and a hammer refresh selection signal HRSEL in response to the refresh counting control signal REFC.

The selector 18 may select the normal refresh row address NRA as a refresh row address RRA in response to the normal refresh selection signal NRSEL, and select the hammer refresh row address HRA as the refresh row address RRA in response to the hammer refresh selection signal HRSEL.

The row decoder 20 may decode the row address RADD in response to the active command ACT to select at least one among a plurality of word line selection signals wl, and decode the refresh row address RRA in response to the refresh command REF to select at least one among the plurality of word line selection signals wl.

The column decoder 22 may decode the column address CADD to select at least one among a plurality of column selection signals csl.

The memory cell array 24 may include a plurality of memory cells, store data in memory cells selected in response to the at least one word line selection signal wl and the at least one column selection signal csl when the write command WR is applied, read data from memory cells selected in response to the at least one word line selection signal wl and the at least one column selection signal csl when the read command RD is applied, and perform a refresh operation on memory cells selected in response to at least one word line selection signal wl when the refresh command REF is applied.

Figure 2:
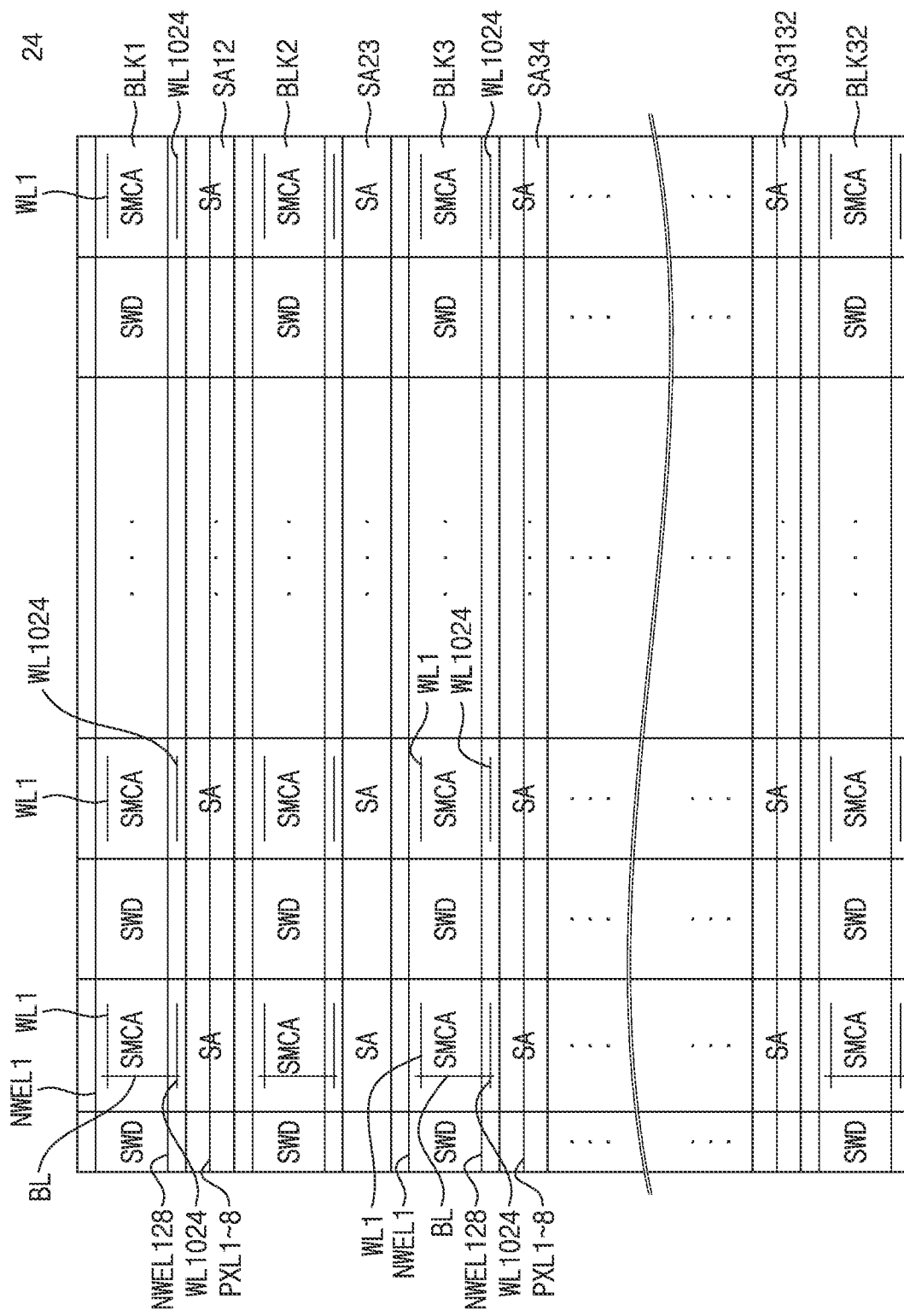
FIG. 2 is a schematic diagram showing a memory cell array according to an exemplary embodiment.

FIG. 2 is a schematic diagram showing a memory cell array according to an exemplary embodiment.

The memory cell array 24 will be described below with reference to FIG. 2.

The memory cell array 24 may include 32 memory cell array blocks BLK1 to BLK32 and 31 sense amplification blocks SA12 to SA3132. Each of the 32 memory cell array blocks BLK1 to BLK32 may include a plurality of sub memory cell array blocks SMCA and a plurality of sub word line drivers SWD, and each of the 31 sense amplification blocks SA12 to SA3132 may include a plurality of sub sense amplification blocks SA. 128 main word lines NWEL1 to NWEL128 and 1024 word lines WL1 to WL1024 may be arranged in each of the 32 memory cell array blocks BLK1 to BLK32. Each of the 32 memory cell array blocks BLK1 to BLK32 may include a plurality of dynamic memory cells (not shown) connected between the 1024 word lines WL1 to WL1024 and a plurality of bit lines BL. In the drawing, a representative one bit line among the plurality of bit lines BL is illustrated. Each of the 31 sense amplification blocks SA12 to SA3132 may be disposed between adjacent memory cell array blocks. 8 word line selection signal lines PXL1 to PXL8 may be arranged in each of the 31 sense amplification blocks SA12 to SA3132.

The sub word line driver SWD arranged in a left side of each of the sub memory cell array blocks SMCA may select one among the word lines WL1 to WL1024 when one among the main word lines NWEL1 to NWEL128 and one among the word line selection signal lines PXL1 to PXL8 are selected. For example, when the main word line NWEL1 of each of the memory cell array blocks BLK1 to BLK32 is selected and the word line selection signal line PXL1 of each of the sense amplification blocks SA12 to SA3132 is selected, the sub word line drivers SWD for each of the memory cell array blocks BLK1 to BLK32 may select the word lines WL1 of the sub memory cell array blocks SMCA of each of the memory cell array blocks BLK1 to BLK32. When the main word line NWEL128 of each of the memory cell array blocks BLK1 to BLK32 is selected and the word line selection signal line PXL8 of each of the sense amplification blocks SA12 to SA3132 is selected, the sub word line drivers SWD for each of the memory cell array blocks BLK1 to BLK32 may select the word lines WL1024 of the sub memory cell array blocks SMCA of each of the memory cell array blocks BLK1 to BLK32. That is, the word lines WL1 to WL1024 of the sub memory cell array blocks SMCA of each of the memory cell array blocks BLK1 to BLK32 may be selected when one of the main word lines NWEL1 to NWEL128 and one of the word line selection signal lines PXL1 to PXL8 are selected.

Each of the 31 sense amplification blocks SA12 to SA3132 may be shared by adjacent memory cell array blocks. When performing the normal refresh operation or the hammer refresh operation, each of the 31 sense amplification blocks SA12 to SA3132 may amplify data read from the plurality of dynamic memory cells connected to a selected one word line of an adjacent one memory cell array block to the bit lines and rewrite the amplified data. Each of the 31 sense amplification blocks SA12 to SA3132 may be shared by two adjacent memory cell array blocks and may not be simultaneously used for the normal refresh operation and the hammer refresh operation of the two adjacent memory cell array blocks.

Figure 3:
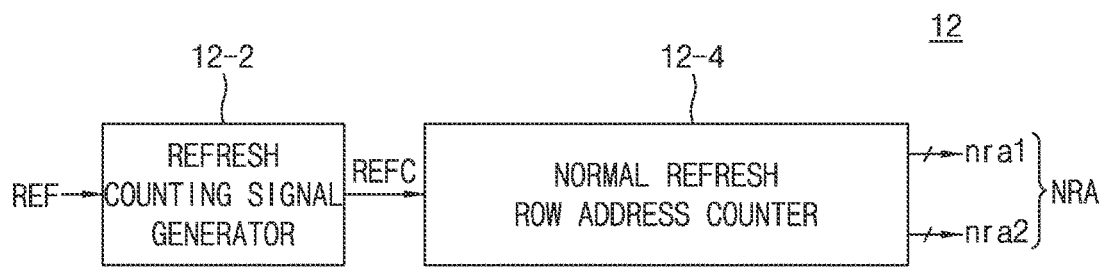
FIG. 3 is a block diagram showing a configuration of a normal refresh row address generator according to an exemplary embodiment.

FIG. 3 is a block diagram showing a configuration of a normal refresh row address generator according to an exemplary embodiment. The normal refresh row address generator 12 may include a refresh counting signal generator 12-2, and a normal refresh row address counter 12-4.

A function of each of the blocks shown in FIG. 3 will be described below.

The refresh counting signal generator 12-2 may generate a refresh counting control signal REFC in response to a refresh command REF. The refresh command REF may be a command indicating a refresh operation on all of memory cells of the memory cell array 24 shown in FIG. 2. The refresh counting control signal REFC may be a control signal for activating each of the 1024 word lines WL1 to WL1024 in each of the 32 memory cell array blocks BLK1 to BLK32 of the memory cell array 24 shown in FIG. 2, in response to the refresh command REF. For example, when each one word line in each of four blocks of the 32 memory cell array blocks BLK1 to BLK32 of the memory cell array 24 shown in FIG. 2 is simultaneously activated to perform a total of 8192 refresh operations, the refresh counting signal generator 12-2 may generate the refresh counting signals REFC activated by a total of 8192 times with a refresh interval tREFi of 3.9 µs during a refresh hold time interval tREFW of 32 ms (See FIG. 7).

The normal refresh row address counter 12-4 may perform a counting operation in response to the refresh counting control signal REFC to generate a normal refresh row address NRA. The normal refresh row address NRA may include a first normal refresh row address nra1 for selecting each of the 1024 word lines WL1 to WL1024 in each of the 32 memory cell array blocks BLK1 to BLK32 of the memory cell array 24 shown in FIG. 2, and a second normal refresh row address nra2 for selecting each of the 32 memory cell array blocks BLK1 to BLK32.

Figure 4:
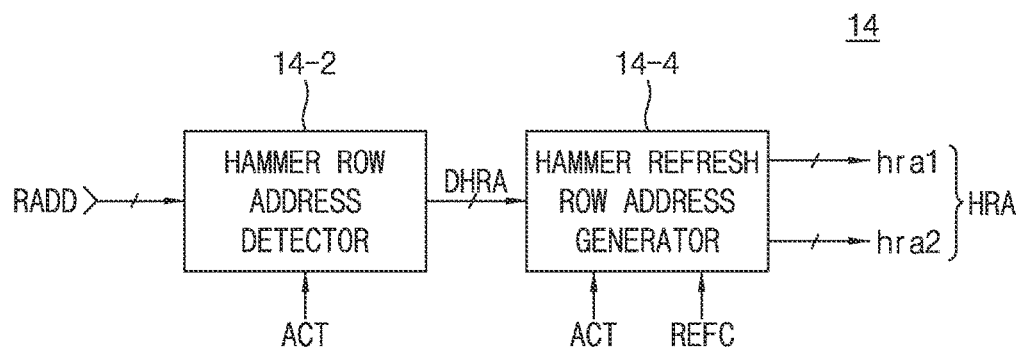
FIG. 4 is a block diagram showing a configuration of a hammer refresh row address detector and generator according to an exemplary embodiment.

FIG. 4 is a block diagram showing a configuration of a hammer refresh row address detector and generator according to an exemplary embodiment. The hammer refresh row address detector and generator 14 may include a hammer row address detector 14-2, and a hammer refresh row address generator 14-4.

A function of each of the blocks shown in FIG. 4 will be described below.

When an identical row address RADD is received a threshold number of times or more in response to an active command ACT, the hammer row address detector 14-2 may determine the identical row address RADD to be a hammer aggressive row address, and detect at least one row address adjacent to the hammer aggressive row address as a hammer victim row address DHRA.

The hammer row address generator 14-4 may store the hammer victim row address DHRA in response to the active command ACT, and generate the hammer victim row address DHRA as a hammer refresh row address HRA in response to the refresh counting control signal REFC. The hammer refresh row address HRA may include a first hammer refresh row address hra1 for selecting among the 1024 word lines WL1 to WL1024 in each of the 32 memory cell array blocks BLK1 to BLK32 of the memory cell array 24 shown in FIG. 2, and a second hammer refresh row address hra2 for selecting among the 32 memory cell array blocks BLK1 to BLK32.

Figure 5:
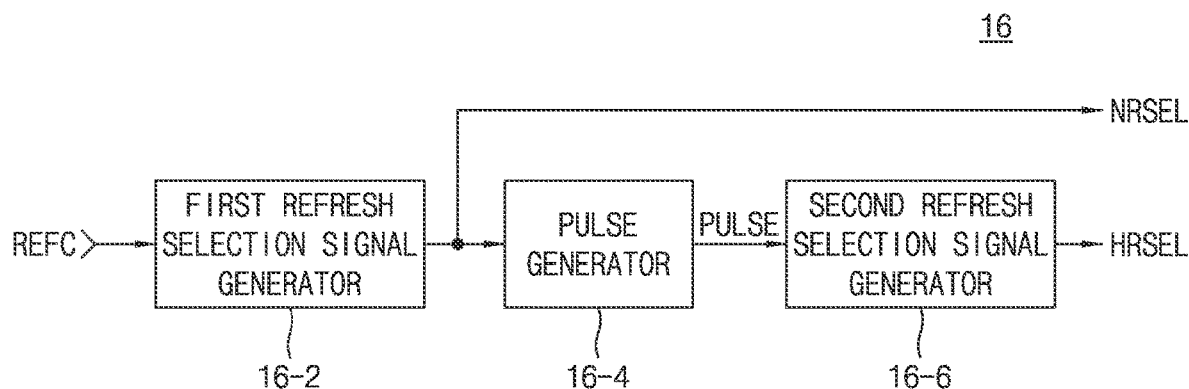
FIG. 5 is a block diagram showing a configuration of a refresh selection signal generator according to an exemplary embodiment.

FIG. 5 is a block diagram showing a configuration of a refresh selection signal generator according to an exemplary embodiment. The refresh selection signal generator 16 may include a first refresh selection signal generator 16-2, a pulse generator 16-4, and a second refresh selection signal generator 16-6.

A function of each of the blocks shown in FIG. 5 will be described below.

The first refresh selection signal generator 16-2 may generate a normal refresh selection signal NRSEL in response to a refresh counting control signal REFC. For example, the first refresh selection signal generator 16-2 may generate the normal refresh selection signal NRSEL activated during a first time in response to the refresh counting control signal REFC. For example, when each one word line in each of four blocks of the 32 memory cell array blocks BLK1 to BLK32 of the memory cell array 24 shown in FIG. 2 is simultaneously activated to perform a total of 8192 normal refresh operations, generally, the refresh counting control signal REFC may be a refresh period tRFC substantially required for the normal refresh operation on each one word line in each of four blocks, for example, a fixed time such as 130 ns or 180 ns, and the first time may be a minimum time tRCmin needed for the normal refresh operation, for example, a time of 50 ns or 60 ns or more. The first time may be predetermined.

The pulse generator 16-4 may generate a pulse signal PULSE in response to the normal refresh selection signal NRSEL. For example, the pulse generator 16-4 may generate the pulse signal PULSE in response to a falling edge of the normal refresh selection signal NRSEL.

The second refresh selection signal generator 16-6 may generate a hammer refresh selection signal HSEL in response to the pulse signal PULSE. For example, the second refresh selection signal generator 16-6 may generate the hammer refresh selection signal HSEL activated during a second time in response to a rising edge or a falling edge of the pulse signal PULSE. For example, when one word line in one block of the 32 memory cell array blocks BLK1 to BLK32 of the memory cell array 24 shown in FIG. 2 is activated to perform a hammer refresh operation, the second time may be a time which is the first time or more. For example, the first time and the second time may be varied according to one refresh period tRFC.

Figure 6:
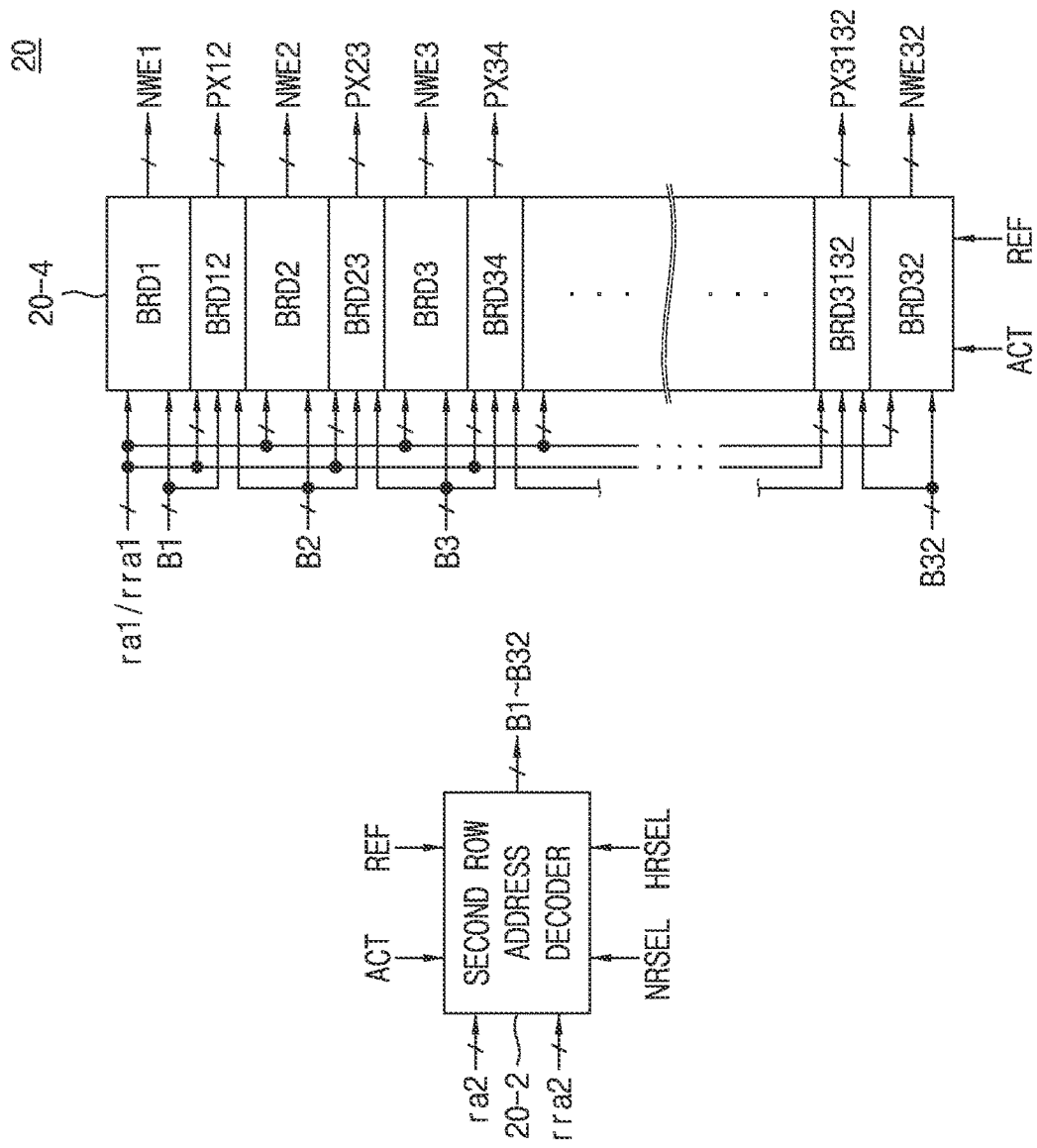
FIG. 6 is a block diagram showing a configuration of a row decoder according to an exemplary embodiment.

FIG. 6 is a block diagram showing a configuration of a row decoder according to an exemplary embodiment. A row decoder 20 may include a second row address decoder 20-2, and a first row address decoder 20-4. The first row address decoder 20-4 may include first block row decoders BRD1 to BRD32, and second block row decoders BRD12 to BRD3132.

The row decoder 20 shown in FIG. 6 is illustrated by assuming that the memory cell array 24 includes the 32 memory cell array blocks BLK1 to BLK32 as shown in FIGS. 2, and 4 memory cell array blocks are simultaneously selected to simultaneously perform a normal refresh operation on a plurality of dynamic memory cells connected to each one word line in each of the 4 memory cell array blocks. Further, the row decoder 20 shown in FIG. 6 is illustrated by assuming that a row address RADD includes a 10-bit first row address ra1 for selecting each of the 1024 word lines WL1 to WL1024 in each of the 32 memory cell array blocks BLK1 to BLK32 of the memory cell array 24 shown in FIG. 2, and a 5-bit second row address ra2 for selecting each of the memory cell array blocks BLK1 to BLK32.

A function of each of the blocks shown in FIG. 6 will be described below.

The second row address decoder 20-2 may decode a 5-bit second row address ra2 or a 5-bit second refresh row address rra2 in response to an active command ACT or a refresh command REF to generate block selection signals B1 to B32. The second row address decoder 20-2 may activate one among the block selection signals B1 to B32 in response to the active command ACT, and activate one among the block selection signals B1 to B32 or simultaneously activate 4 block selection signals (for example (B1, B9, B17, B25), (B2, B10, B18, B26), (B3, B11, B19, B27), (B4, B12, B20, B28), (B5, B13, B21, B29), (B6, B14, B22, B30), (B7, B15, B23, B31), or (B8, B16, B24, B32)) in response to the refresh command REF. For example, the second row address decoder 20-2 may decode a lower 3-bits excluding a upper 2-bits of the 5-bit second refresh row address rra2 in response to the refresh command REF and a normal refresh selection signal NRSEL to simultaneously activate 4 block selection signals, or decode the 5-bit second refresh row address rra2 in response to the refresh command REF and the hammer refresh selection signal HRSEL to activate one block selection signal.

The first block row decoders BRD1 to BRD32 may decode an x-bit of the first row address ra1 in response to the active command ACT and the block selection signals B1 to B32, respectively, to generate 32 main word line selection signals NWE1 to NWE32, respectively. Further, the first block row decoders BRD1 to BRD32 may decode an x-bit of the first refresh row address rra1 in response to the refresh command REF and the block selection signals B1 to B32, respectively, to generate the main word line selection signals NWE1 to NWE32, respectively. For example, each of the first block row decoders BRD1 to BRD32 may decode an upper 7-bits of the 10-bit first row address ra1 or an upper 7-bits of the 10-bit first refresh row address rra1 to generate the main word line selection signals NWE1 to NWE32, respectively. Each of the main word line selection signals NWE1 to NWE32 may select the 128 main word lines NWEL1 to NWEL128 in each of the 32 memory cell array blocks BLK1 to BLK32 shown in FIG. 2.

The second block row decoders BRD12 to BRD3132 may decode a y-bit of the first row address ra1 in response to the active command ACT and the block selection signals B1 to B32, respectively, to generate word line selection signals PX12 to PX3132, respectively. Further, the second block row decoders BRD12 to BRD3132 may decode a y-bit of the first refresh row address rra1 in response to the refresh command REF and the block selection signals B1 to B32, respectively, to generate the word line selection signals PX12 to PX3132, respectively. For example, the second block row decoders BRD12 to BRD3132 may decode a lower 3-bits of the 10-bit first row address ra1 or a lower 3-bits of the 10-bit first refresh row address rra1 to generate the word line selection signals PX12 to PX3132, respectively. Each of the word line selection signals PX12 to PX3132 may select the 8 word line selection signal lines PXL1 to PXL8 shown in FIG. 2.

The word lines WL1 to WL1024 in each of the 32 memory cell array blocks BLK1 to BLK32 of the memory cell array 24 shown in FIG. 2 may be selected by combining the 128 corresponding main word line selection signals NWE1, NWE2, . . . , or NWE32 and the 8 corresponding word line selection signals PX12, PX23, . . . , or PX3132.

Figure 7:
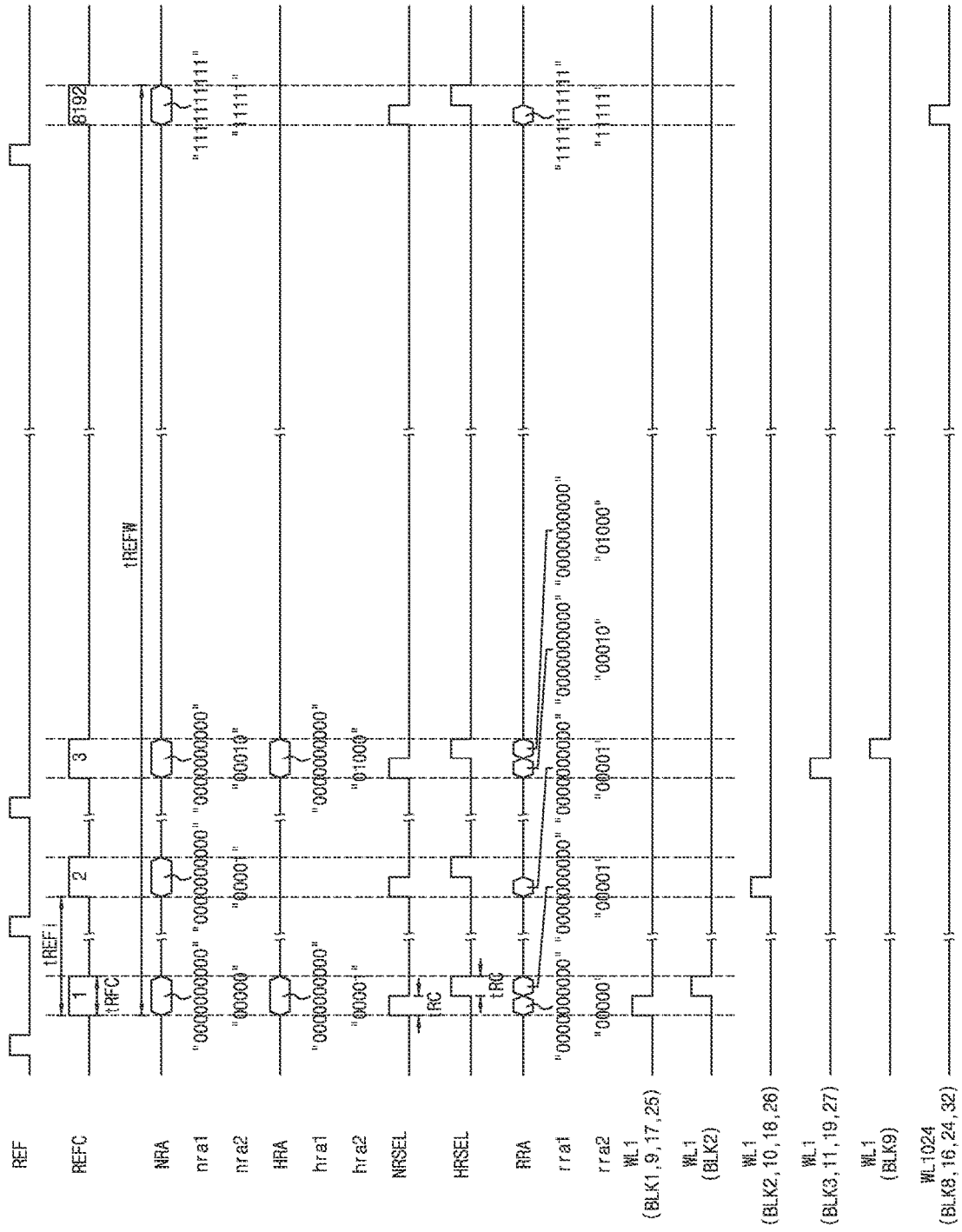
FIG. 7 is an operation timing diagram for describing a refresh operation of a semiconductor memory device according to an exemplary embodiment.

FIG. 7 is an operation timing diagram for describing a refresh operation of a semiconductor memory device according to an exemplary embodiment.

A refresh operation according to an exemplary embodiment will be described below with reference to FIGS. 1 to 7.

When the refresh command REF is generated, the normal refresh row address generator 12 shown in FIGS. 2 and 3 may generate the refresh counting control signal REFC (1). For example, the refresh counting control signal REFC may be generated a total of 8192 times with the refresh interval tREFi of 3.9 µs during the refresh hold time interval tREFW of 32 ms. The normal refresh row address generator 12 may perform a counting operation in response to the refresh counting control signal REFC to generate the normal refresh row address NRA which is "000000000000000". A lower 10-bits, i.e., "0000000000", among the normal refresh row address NRA which is 15-bits "000000000000000" may be the first normal refresh row address rra1, and "00000" which is an upper 5-bits among the normal refresh row address NRA which is "000000000000000" may be the second normal refresh row address rra2.

For example, the hammer row address detector and generator 14 shown in FIGS. 2 and 4 may generate the hammer refresh row address HRA which is "000010000000000" stored in response to the refresh counting control signal REFC. A lower 10-bits, i.e., "0000000000", among the hammer refresh row address HRA which is 15-bits "000010000000000" may be the first hammer refresh row address hra1, and "00001" which is an upper 5-bits among the hammer refresh row address HRA which is "000010000000000" may be the second hammer refresh row address hra2.

The refresh selection signal generator 16 shown in FIGS. 2 and 5 may generate the normal refresh selection signal NRSEL in response to the refresh counting control signal REFC, and generate the hammer refresh selection signal HRSEL in response to the normal refresh selection signal HRSEL. For example, the refresh selection signal generator 16 may sequentially generate the normal refresh selection signal NRSEL and the hammer refresh selection signal HRSEL by time-dividing an activation time of the refresh counting control signal REFC. The activation time of each of the normal refresh selection signal NRSEL and the hammer refresh selection signal HRSEL may be a minimum time to perform the refresh operation one time.

The selector 18 shown in FIG. 2 may generate the normal refresh row address NRA which is "000000000000000" as the refresh row address RRA in response to the normal refresh selection signal NRSEL. A lower 10-bits, i.e., "0000000000", among the refresh row address RRA which is 15-bits "000000000000000" may be the first refresh row address rra1, and "00000" which is an upper 5-bits among the refresh row address RRA which is "000000000000000" may be the second refresh row address rra2. The second row address decoder 20-2 shown in FIG. 6 may decode the second refresh row address rra2 which is "000" which is a lower 3-bits excluding an upper 2-bits among the second refresh row address rra2 which is 5-bits "00000" to activate the block selection signals B1, B9, B17, B25, and the first block row decoders BRD1, BRD9, BRD17, BRD25 of the first row address decoder 20-4 may decode an upper 7-bits of the first refresh row address rra1 which is 10-bits "0000000000" in response to the block selection signals B1, B9, B17, B25 to activate one among the main word line selection signals NWE1. The second block row decoders BRD12, BRD910, BRD1718, BRD2526 may decode a lower 3-bits of the first refresh row address rra1 which is 10-bits "0000000000" in response to the block selection signals B1, B9, B17, B15 to activate one among the word line selection signals PX12, PX910, PX1718, PX2526. For example, the normal refresh operation may be performed on memory cells connected to the word line WL1 selected by a selection signal for selecting the main word line NWEL1 and the word line selection signal PX1 of each of the memory cell array blocks BLK1, BLK9, BLK17, BLK25.

The selector 18 shown in FIG. 2 may generate the hammer refresh row address HRA which is 15-bits "000010000000000" as the refresh row address RRA in response to the hammer refresh selection signal HRSEL. A lower 10-bits "0000000000" among the refresh row address RRA which is 15-bits "000010000000000" may be the first refresh row address rra1, and "00001" which is an upper 5-bits among the refresh row address RRA which is 15-bits "000000000000000" may be the second refresh row address rra2. The second row address decoder 20-2 shown in FIG. 6 may decode the second refresh row address rra2 which is "00001" to activate the block selection signal B2, and the first block row decoder BRD2 of the first row address decoder 20-4 may decode an upper 7-bits of the first refresh row address rra1 which is 10-bits "0000000000" in response to the block selection signal B2 to activate one among the main word line selection signals NWE1. The second block row decoder BRD12 may decode a lower 3-bits of the first refresh row address rra1 which is 10-bits "0000000000" in response to the block selection signal B2 to activate one among the word line selection signals PX12. For example, the hammer refresh operation may be performed on memory cells connected to the word line WL1 selected by a selection signal for selecting the main word line NWEL1 and the word line selection signal PX1 of the memory cell array block BLK2.

Accordingly, the normal refresh operation on the memory cell array blocks BLK1, BLK9, BLK17, BLK25, and the hammer refresh operation on the adjacent memory cell array block BLK2 sharing the sense amplification block SA12 with the memory cell array block BLK1 may be sequentially performed by time-division. That is, the normal refresh operation and the hammer refresh operation may be sequentially performed during the refresh period tRFC of 3.9 μs.

Although not illustrated in FIG. 7, when the hammer refresh row address HRA is "000001111111111", the hammer refresh operation may be performed on memory cells connected to the word line WL1024 selected by a selection signal for selecting the main word line NWEL128 and the word line selection signal PX8 of the memory cell array block BLK1 which is the same as the memory cell array block BLK1 in which the normal refresh operation is performed. That is, the normal refresh operation on the memory cell array blocks BLK1, BLK9, BLK17, BLK25, and the hammer refresh operation on the memory cell array block BLK1 may be sequentially performed by time-division during the refresh period tRFC.

Although not illustrated in FIG. 7, a normal read/write operation may be performed during a period between the refresh counting control signals REFC, and during the period between the refresh counting control signals REFC, the hammer refresh row address detector and generator 14 shown in FIGS. 2 and 4 may perform an operation of detecting the hammer refresh row address HRA.

Next, the normal refresh row address generator 12 shown in FIGS. 2 and 3 may perform the counting operation in response to the refresh counting control signal REFC (2) to generate the normal refresh row address NRA which is "000010000000000", and the hammer row address detector and generator 14 shown in FIGS. 2 and 4 may not generate the hammer refresh row address HRA. The normal refresh operation may be performed on memory cells connected to the word line WL1 selected by a selection signal for selecting the main word line NWEL1 and the word line selection signal PX1 of each of the memory cell array blocks BLK2, BLK10, BLK18, BLK26. Since the hammer refresh row address HRA is not generated, the hammer refresh operation may not be performed.

In response to the refresh counting control signal REFC (3), the normal refresh operation may be performed on memory cells connected to the word line WL1 selected by a selection signal for selecting the main word line NWEL1 and the word line selection signal PX1 of each of the memory cell array blocks BLK3, BLK11, BLK19, BLK27 and the hammer refresh operation may be performed on memory cells connected to a selection signal for selecting the main word line NWEL1 and the word line selection signal PX1 of the memory cell array block BLK9.

Lastly, in response to the refresh counting control signal REFC (8192), the normal refresh operation may be performed on memory cells connected to the word line WL1024 selected by a selection signal for selecting the main word line NWEL128 and the word line selection signal PX8 of each of the memory cell array blocks BLK8, BLK16, BLK24, BLK32, and since the hammer refresh row address HRA is not generated, the hammer refresh operation may not be performed.

In the embodiments described above, it is described that the hammer refresh operation is performed on one memory cell array block, however, even in the hammer refresh operation, like the normal refresh operation, the hammer refresh operation may be simultaneously performed on 4 memory cell array blocks by decoding the lower 3-bits excluding the upper 2-bits of the second refresh row address rra2.

Figure 8:
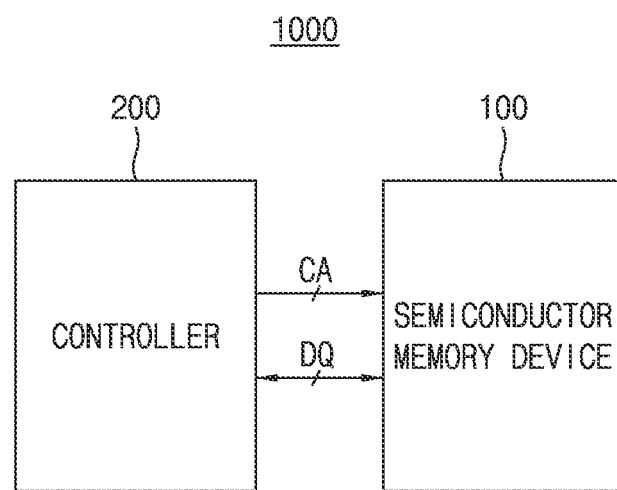
FIG. 8 is a block diagram showing a memory system according to an exemplary embodiment.

FIG. 8 is a block diagram showing a memory system according to an exemplary embodiment. A memory system 1000 may include a controller 200 and a semiconductor memory device 100.

With reference to FIG. 8, the controller 200 may be a central processing unit (CPU). The controller 200 may transmit a command and address CA, and transmit or receive data DQ.

The semiconductor memory device 100 may transmit or receive data DQ. The semiconductor memory device 100 may be the semiconductor memory device described with reference to FIGS. 1 to 7. As another example, the semiconductor memory device 100 shown in FIG. 8 may be a memory module in which a plurality of semiconductor memory devices are installed.

According to the embodiment, the controller 200 does not need to apply a separate command related to the hammer refresh operation, and the semiconductor memory device 100 may perform the normal refresh operation and the hammer refresh operation by time-division in response to one refresh command REF as described above.

Figure 9:
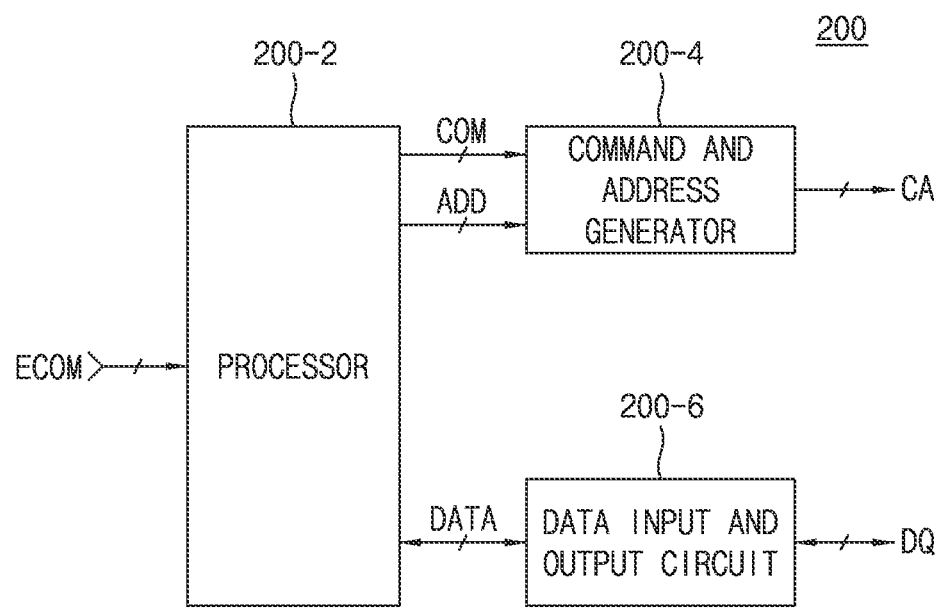
FIG. 9 is a block diagram showing a configuration of a controller according to an exemplary embodiment.

FIG. 9 is a block diagram showing a configuration of a controller according to an exemplary embodiment. A controller 200 may include a processor 200-2, a command and address generator 200-4, and data input and output circuit 200-6.

A function of each of the blocks shown in FIG. 9 will be described below.

The processor 200-2 may execute a program according to an external command ECOM to generate a command COM and an address ADD, and transmit or receive data DQ. For example, the processor 200-2 may communicate with various input devices (not shown), for example, a keyboard, a mouse, a touch sensor, or a sound, fingerprint or motion recognition sensor, etc. to receive the external command ECOM, execute the program according to the external command ECOM to generate the command COM, the address ADD, and the data DATA, and receive and process the data DATA to output to various output devices (not shown), for example, a display device or a sound output device, etc.

The command and address generator 200-4 may receive the command COM and the address ADD to generate the command and address CA.

The data input and output circuit 200-6 may receive the data DATA to generate the data DQ, or receive the data DQ to generate the data DATA.

In the example embodiments described above, the term "adjacent" may denote "physically adjacent". That is, an adjacent row address adjacent to a row address may denote a row address selecting a word line physically adjacent to a word line selected by the row address, an adjacent memory cell array block adjacent to a memory cell array block may denote a memory cell array block physically adjacent to the memory cell array block, and an adjacent block selection signal adjacent to a block selection signal may denote a block selection signal selecting a memory cell array block physically adjacent to a memory cell array block selected by the block selection signal.

According to the exemplary embodiments, the semiconductor memory device may sequentially perform the normal refresh operation and the hammer refresh operation by time division during the refresh interval. Accordingly, the controller does not need to apply a separate command or allocate a separate time to perform the hammer refresh operation.

While various embodiments have been described with reference to the accompanying drawings, it will be understood by those skilled in the art that various modifications may be made without departing from the scope of the present disclosure and without changing essential features thereof. Therefore, the above-described embodiments should be considered in a descriptive sense only and not for the purposes of limitation.

What is claimed is:

1. An operating method of a memory device, comprising:
   receiving a refresh command from a controller;
   performing a first refresh operation on a plurality of memory blocks in response to the refresh command; and
   performing a second refresh operation on at least one of the plurality of memory blocks in response to the refresh command,
   wherein the performing the second refresh operation includes:
     generating a refresh counting control signal in response to the refresh command; and
     generating a hammer refresh row address in response the refresh counting control signal, and
   wherein the first refresh operation and the second refresh operation are sequentially performed by time-division during a refresh hold time interval.

2. The method of claim 1, wherein the refresh command includes an auto refresh command.

3. The method of claim 1, wherein the performing the first refresh operation includes generating a normal refresh row address in response to the refresh counting control signal.

4. The method of claim 3, further comprising generating a normal refresh selection signal and a hammer refresh selection signal in response to the refresh counting control signal.

5. The method of claim 4, further comprising:
   selecting the normal refresh row address as a refresh row address in response to the normal refresh selection signal; and
   selecting the hammer refresh row address as the refresh row address in response to the hammer refresh selection signal.

6. The method of claim 1, wherein the memory device includes a plurality of sense amplification circuits, and each of the plurality of sense amplification circuits is shared by at least two adjacent memory blocks.

7. The method of claim 6, wherein the each of the plurality of sense amplification circuits is not used simultaneously for the first refresh operation and the second refresh operation.

8. The method of claim 1, wherein the generating the hammer refresh row address includes:
   receiving a row address in response to an active command;
   detecting a hammer aggressive row address corresponding to the row address;

storing a hammer victim row address adjacent to the hammer aggressive row address as a hammer row address; and generating the hammer row address as the hammer refresh row address in response to the refresh counting control signal.

9. A memory device comprising:
a plurality of memory blocks, each of the plurality of memory blocks having memory cells connected a plurality of wordlines and a plurality of bitlines;
a row decoder configured to select one wordline among the plurality of wordlines according to a row address;
a plurality of sense amplification circuits configured to select at least one of the plurality of bitlines according to a column address;
a command and address generator configured to receive a command and address from a memory controller, to decode the command and address to generate the row address with an active command, and to generate the column address with a read command or a write command; and
a refresh controller configured to perform a first refresh operation on the plurality of memory blocks in response to a refresh command and to perform a second refresh operation on at least one of the plurality of memory blocks in response to the refresh command,
wherein the refresh controller is further configured to sequentially perform the first refresh operation and the second refresh operation by time-division during a refresh interval.

10. The memory device of claim 9, wherein the refresh command is received from the memory controller or is internally generated.

11. The memory device of claim 9, wherein each of the plurality of sense amplification circuits is not used simultaneously for the first refresh operation and the second refresh operation.

12. The memory device of claim 9, further comprising a hammer refresh row address generator configured to receive a row address from the memory controller in response to an active command, to detect a hammer aggressive row address corresponding to the row address, to store a hammer victim row address adjacent to the hammer aggressive row address as a hammer row address, and to generate the hammer row address as a hammer refresh row address in response to a refresh counting control signal,
wherein the refresh counting control signal is generated in response to the refresh command.

13. A memory system comprising:
at least one memory device; and
a memory controller configured to control the at least one memory device,
wherein the at least one memory device is configured to receive a refresh command from the memory controller, to perform a first refresh operation on a plurality of memory blocks in response to the refresh command, and to perform a second refresh operation on at least one of the plurality of memory blocks in response to the refresh command, and
wherein the first refresh operation and the second refresh operation are sequentially performed by time-division during a refresh hold time interval.

14. The memory system of claim 13, wherein the memory controller is further configured to periodically transmit the refresh command to the at least one memory device.

15. The memory system of claim 13, wherein the memory controller is further configured to issue the refresh command corresponding to total number of active commands.

16. The memory system of claim 13, wherein the at least one memory device is further configured to generate a refresh counting control signals with a refresh interval, and
wherein the refresh counting control signals are activated by a total of predetermined times during the refresh hold time interval.

* * * * *